United States Patent
Kai et al.

(10) Patent No.: US 8,336,000 B2
(45) Date of Patent: Dec. 18, 2012

(54) METHOD FOR DETERMINING POSITION OF AUXILIARY PATTERN, METHOD FOR MANUFACTURING PHOTOMASK, AND METHOD FOR MANUFACTURING SEMICONDUCTOR DEVICE

(75) Inventors: Yasunobu Kai, Kanagawa-ken (JP); Katsuyoshi Kodera, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/230,187

(22) Filed: Sep. 12, 2011

(65) Prior Publication Data

US 2012/0064732 A1   Mar. 15, 2012

(30) Foreign Application Priority Data

Sep. 14, 2010   (JP) ................ 2010-205754

(51) Int. Cl.
  *G01B 11/00*   (2006.01)
  *G01B 11/30*   (2006.01)
  *G01B 11/24*   (2006.01)
  *G01B 11/14*   (2006.01)
  *G06F 17/50*   (2006.01)
  *H01L 21/469*  (2006.01)

(52) U.S. Cl. .......... 716/50; 356/615; 356/620; 356/401; 356/601; 438/778; 438/942; 257/E21.023

(58) Field of Classification Search .................. None
See application file for complete search history.

(56) References Cited

U.S. PATENT DOCUMENTS

| | | | | |
|---|---|---|---|---|
| 5,270,796 A | * | 12/1993 | Tokui et al. ............ | 356/394 |
| 7,106,444 B2 | * | 9/2006 | Nakajima ................ | 356/401 |
| 7,849,423 B1 | * | 12/2010 | Yenikaya et al. ........ | 716/132 |
| 8,227,178 B2 | * | 7/2012 | Sakuma et al. .......... | 430/321 |
| 2002/0062204 A1 | * | 5/2002 | Nakajima ............... | 702/150 |
| 2005/0142470 A1 | | 6/2005 | Socha et al. | |
| 2007/0011647 A1 | * | 1/2007 | Abrams et al. .......... | 716/21 |
| 2007/0198966 A1 | * | 8/2007 | Abrams et al. .......... | 716/21 |
| 2011/0049735 A1 | * | 3/2011 | Sakuma et al. .......... | 264/1.24 |
| 2012/0064732 A1 | * | 3/2012 | Kai et al. ............... | 438/778 |

FOREIGN PATENT DOCUMENTS

JP   2009-31320   2/2009

* cited by examiner

*Primary Examiner* — Seahvosh Nikmanesh
*Assistant Examiner* — Evren Seven
(74) *Attorney, Agent, or Firm* — Finnegan, Henderson, Farabow, Garrett & Dunner, L.L.P.

(57) ABSTRACT

According to one embodiment, a method is disclosed for determining position of an auxiliary pattern on a photomask. The method can include generating a first set for each of three or more imaging positions of an exposure optical system. The method can include generating a second set for each of the three or more imaging positions by inverse Fourier transforming each of the first set. The method can include calculating a second order differential with respect to the imaging position of an index indicating amplitude of light belonging to the second set. In addition, the method can include extracting a position where the second order differential assumes an extremal value on an imaging plane of the exposure optical system. At least part of positions on the photomask each corresponding to the position assuming the extremal value on the imaging plane is used as a formation position of the auxiliary pattern.

10 Claims, 10 Drawing Sheets

FIG. 9A  FIRST COMPARATIVE EXAMPLE (NO AUXILIARY PATTERN)
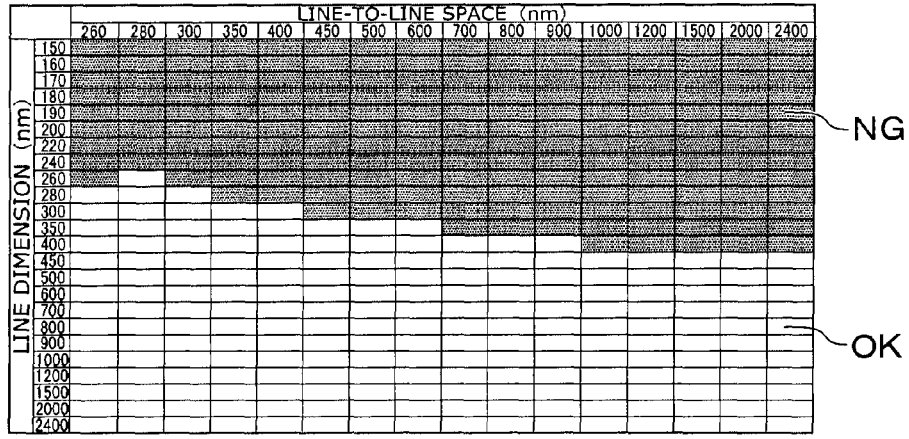
FIG. 9B  SECOND COMPARATIVE EXAMPLE
(AUXILIARY PATTERN PLACED BY PSF INDEX)
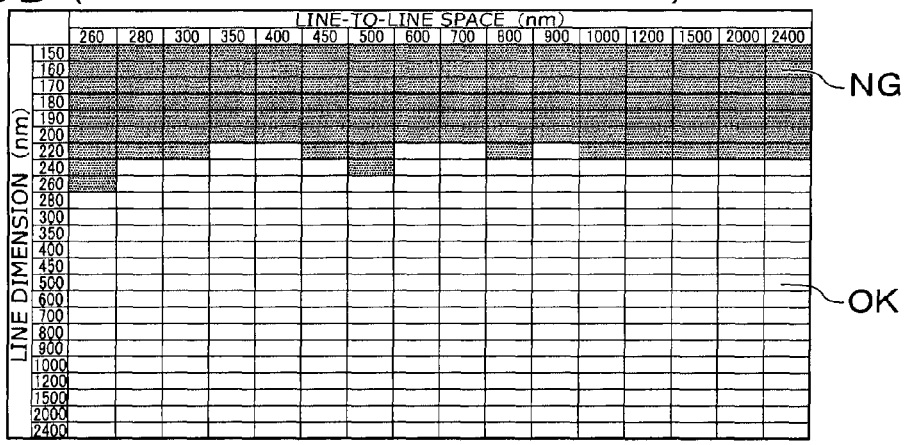
FIG. 9C  PRACTICAL EXAMPLE
(AUXILIARY PATTERN PLACED BY DIFFERENTIAL PSF INDEX)
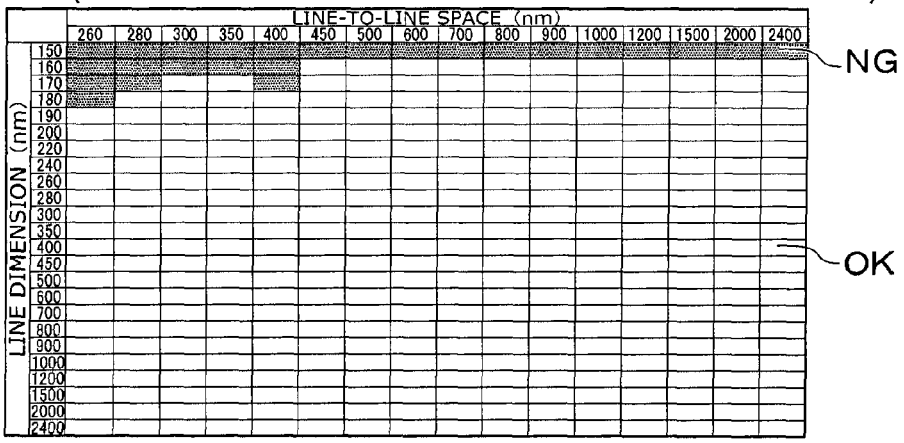

METHOD FOR DETERMINING POSITION OF AUXILIARY PATTERN, METHOD FOR MANUFACTURING PHOTOMASK, AND METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2010-205754, filed on Sep. 14, 2010; the entire contents of which are incorporated herein by reference.

FIELD

Embodiments described herein relate generally to a method for determining position of auxiliary pattern, a method for manufacturing a photomask, and a method for manufacturing a semiconductor device.

BACKGROUND

Recently, to increase the packing density of semiconductor devices, there is demand for further thinning of line width. On the other hand, the resolution power of exposure apparatuses is approaching its limit. Thus, techniques for lithography in the resolution limit region are required. For lithography in the resolution limit region, the illumination condition of the exposure apparatus must be adapted to the finest pattern (closest pattern) in the semiconductor device. Thus, the problem is that it is difficult to ensure a sufficient lithography margin in the case of exposure for circuit patterns other than the closest pattern.

To improve the lithography margin, in a photomask, it is effective to provide a fine auxiliary pattern not resolved on the wafer, besides the main pattern corresponding to the circuit pattern to be formed. Conventionally, the placement position of the auxiliary pattern is determined by exhaustive or exploratory techniques. However, the placement position of the auxiliary pattern has a huge number of combinations. Hence, it takes a long time to determine the placement position of the auxiliary pattern.

BRIEF DESCRIPTION OF THE DRAWINGS

FIG. 4A shows the closest pattern, and FIG. 4B shows the other patterns;

FIGS. 9A to 9C show lithography margins for a plurality of circuit patterns with different line widths and line-to-line spaces, FIG. 9A shows a first comparative example, FIG. 9B shows a second comparative example, and FIG. 9C shows a practical example of the embodiment.

DETAILED DESCRIPTION

Figure 1:
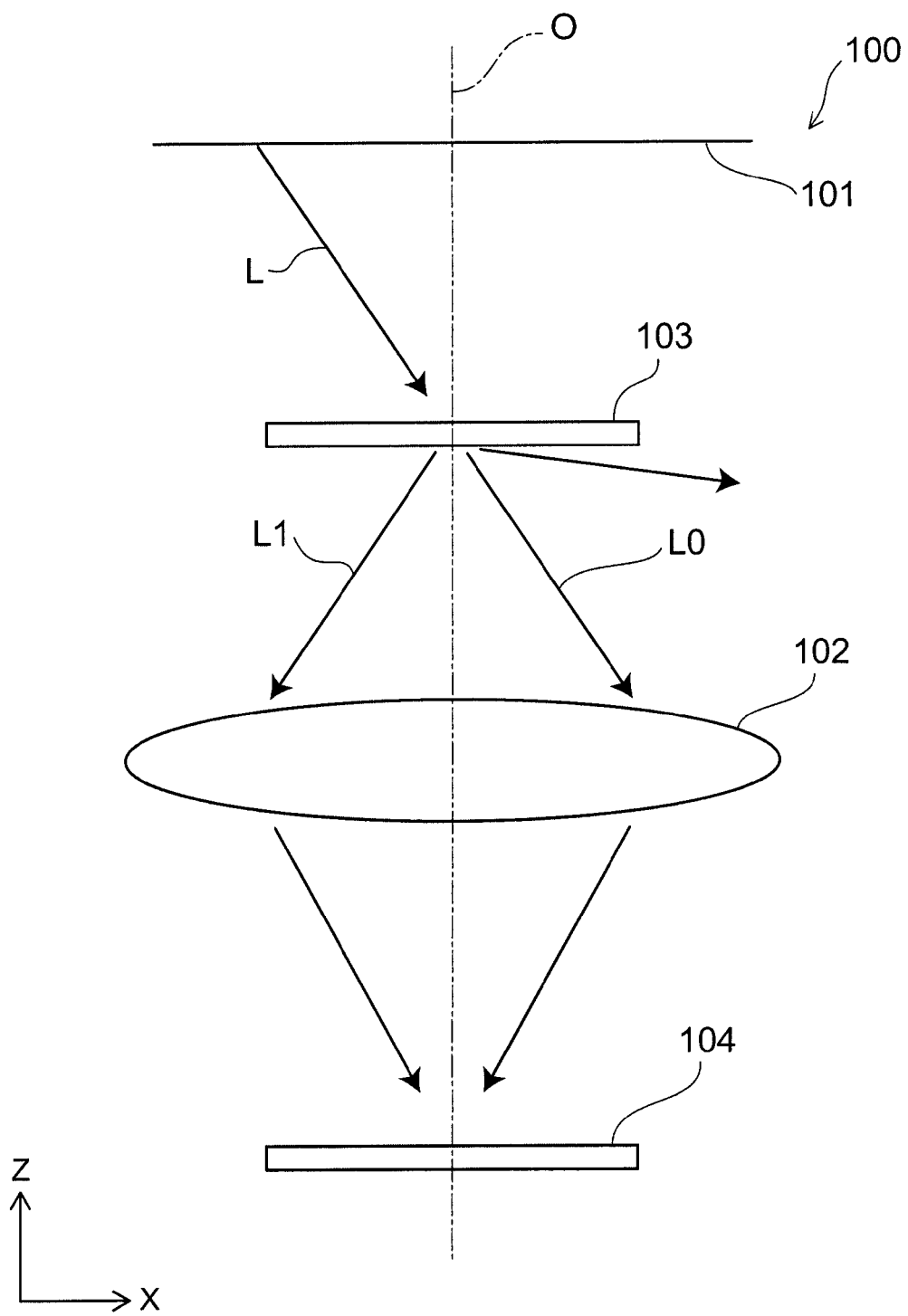
FIG. 1 is an optical model diagram illustrating an exposure optical system in a first embodiment.

In general, according to one embodiment, a method is disclosed for determining position of an auxiliary pattern on a photomask. The method can include generating a first set for each of three or more imaging positions of an exposure optical system by extracting a linearly treatable portion from a transmission cross coefficient for each of the three or more imaging positions. The method can include generating a second set for each of the three or more imaging positions by inverse Fourier transforming each of the first set. The method can include calculating a second order differential with respect to the imaging position of an index indicating amplitude of light belonging to the second set. In addition, the method can include extracting a position where the second order differential assumes an extremal value on an imaging plane of the exposure optical system. At least part of positions on the photomask each corresponding to the position assuming the extremal value on the imaging plane is used as a formation position of the auxiliary pattern.

In general, according to one other embodiment, a method is disclosed for manufacturing a photomask. The method can include forming a light shielding film on a transparent substrate. In addition, the method can include forming a main pattern and an auxiliary pattern on the transparent substrate by selectively removing the light shielding film. Placement position of the auxiliary pattern is determined by a method for determining position of the auxiliary pattern on the photomask. The method for determining the position of the auxiliary pattern on the photomask includes generating a first set for each of three or more imaging positions of an exposure optical system by extracting a linearly treatable portion from a transmission cross coefficient for each of the three or more imaging positions. The method includes generating a second set for each of the three or more imaging positions by inverse Fourier transforming each of the first set. The method includes calculating a second order differential with respect to the imaging position of an index indicating amplitude of light belonging to the second set. In addition, the method includes extracting a position where the second order differential assumes an extremal value on an imaging plane of the exposure optical system. At least part of positions on the photomask each corresponding to the position assuming the extremal value on the imaging plane is used as a formation position of the auxiliary pattern.

In general, according to one other embodiment, a method is disclosed for manufacturing a semiconductor device. The method can include forming a resist film on a wafer. The method can include performing exposure on the resist film using a photomask manufactured by a method for manufacturing the photomask. The method can include forming a resist pattern by developing the resist film. The method can include performing processing on the wafer using the resist pattern as a mask. The method for manufacturing the photomask includes forming a light shielding film on a transparent substrate. The method includes forming a main pattern and an auxiliary pattern on the transparent substrate by selectively removing the light shielding film. Placement position of the auxiliary pattern is determined by a method for determining position of the auxiliary pattern on the photomask. The method for determining the position of the auxiliary pattern on the photomask includes generating a first set for each of three or more imaging positions of an exposure optical system by extracting a linearly treatable portion from a transmission cross coefficient for each of the three or more imaging positions. The method includes generating a second set for each of the three or more imaging positions by inverse Fourier transforming each of the first set. The method includes calculating a second order differential with respect to the imaging position of an index indicating amplitude of light belonging to the second set. In addition, the method includes extracting a position where the second order differential assumes an extremal value on an imaging plane of the exposure optical system. At least part of positions on the photomask each corresponding to the position assuming the extremal value on the imaging plane is used as a formation position of the auxiliary pattern, the main pattern is formed in a line shape, and the main pattern is periodically arranged.

Various embodiments will be described hereinafter with reference to the accompanying drawings.

First, a first embodiment is described.

FIG. 1 is an optical model diagram illustrating an exposure optical system in the embodiment.

Figure 2A:
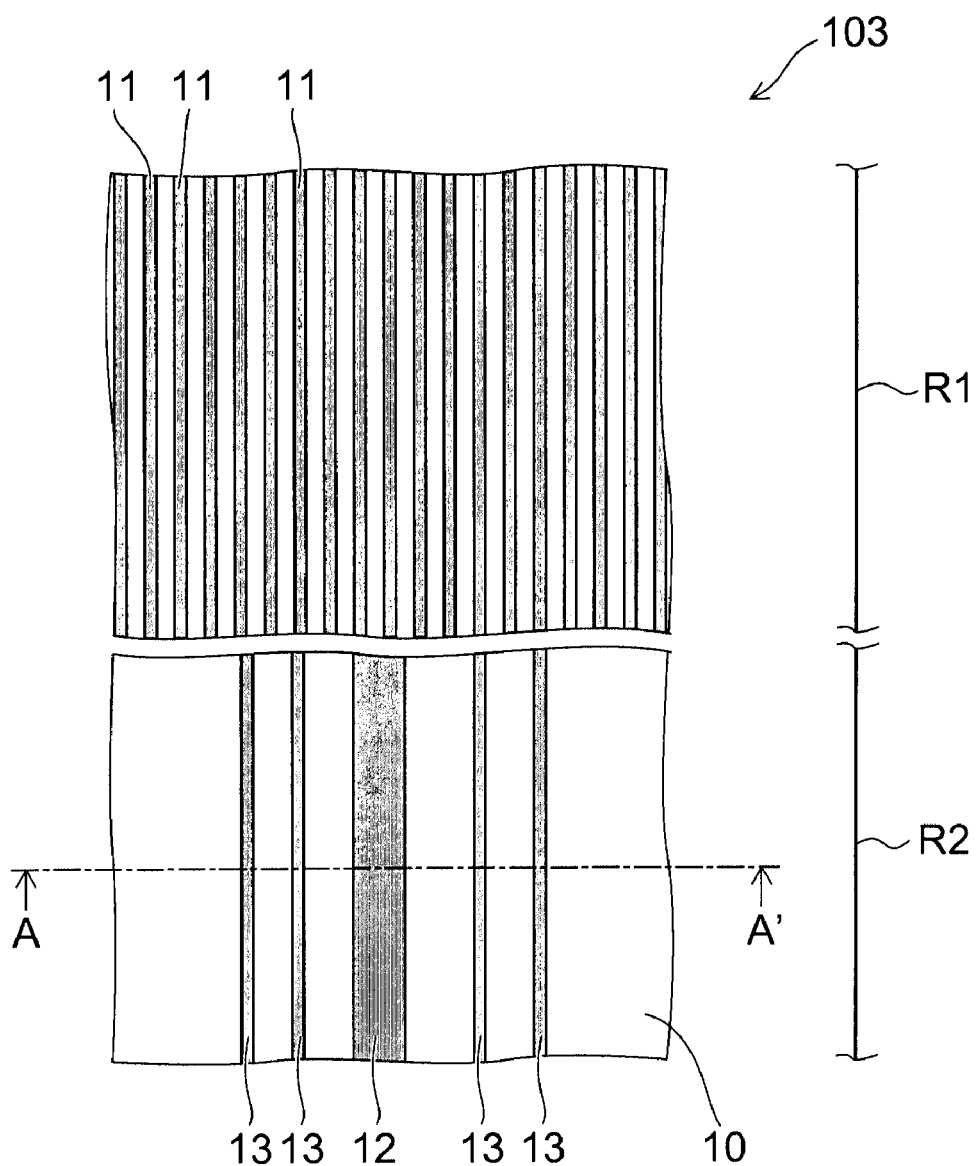
FIG. 2A is a plan view illustrating a photomask.
Figure 2B:
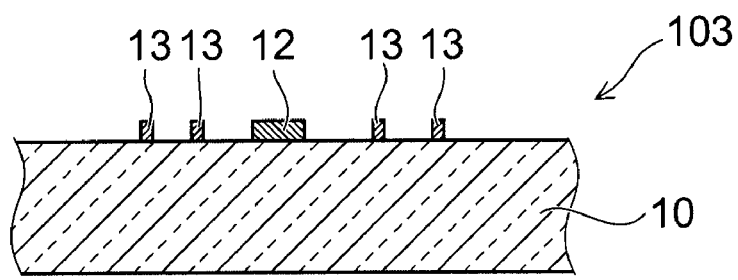
FIG. 2B is a sectional view taken along line A-A' shown in FIG. 2A.

FIG. 2A is a plan view illustrating a photomask, and FIG. 2B is a sectional view taken along line A-A' shown in FIG. 2A.

Figure 3:
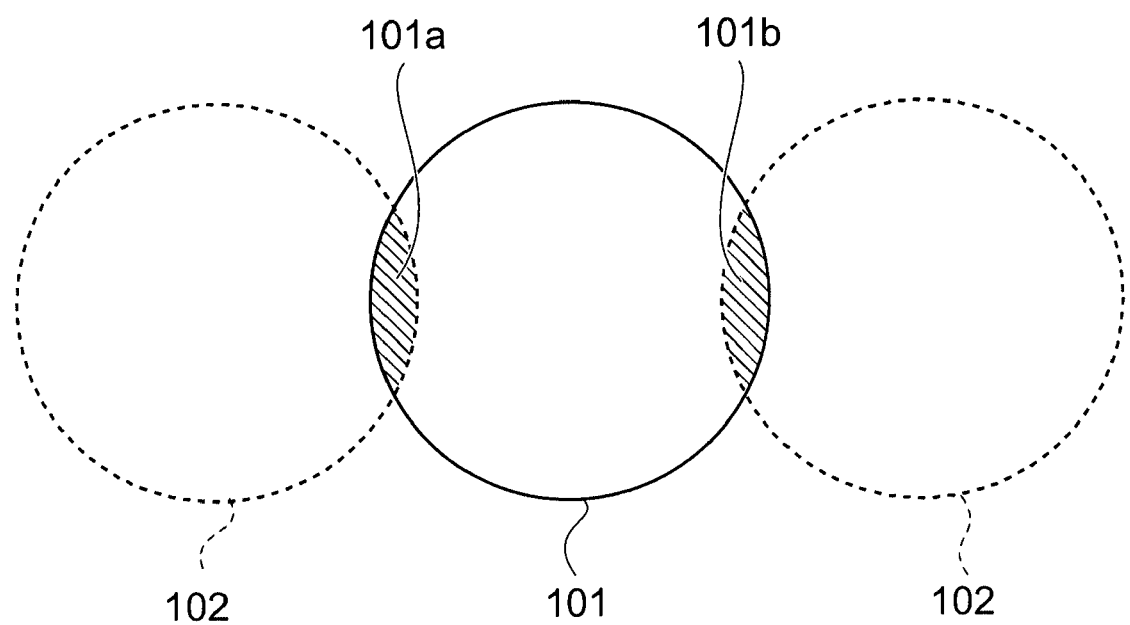
FIG. 3 illustrates a light source layout in the first embodiment.

FIG. 3 illustrates a light source layout in the embodiment.

Figure 4A:
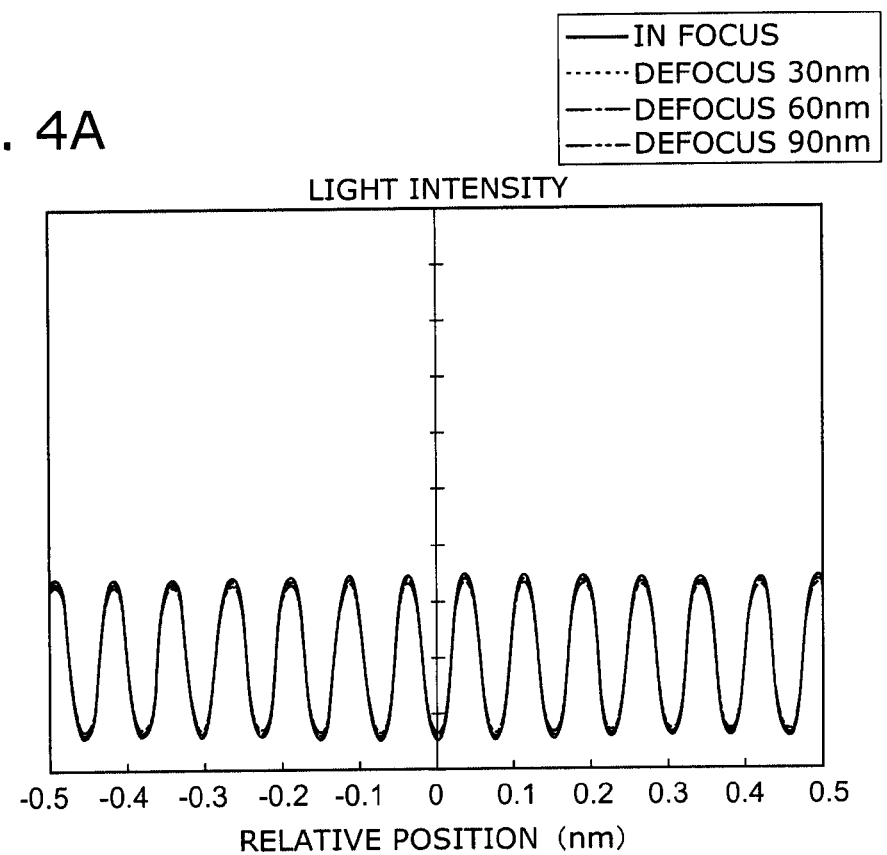
FIGS. 4A and 4B are graphs illustrating the change of the optical image with respect to the variation of focus, where the horizontal axis represents position on the wafer, and the vertical axis represents light intensity.
Figure 4B:
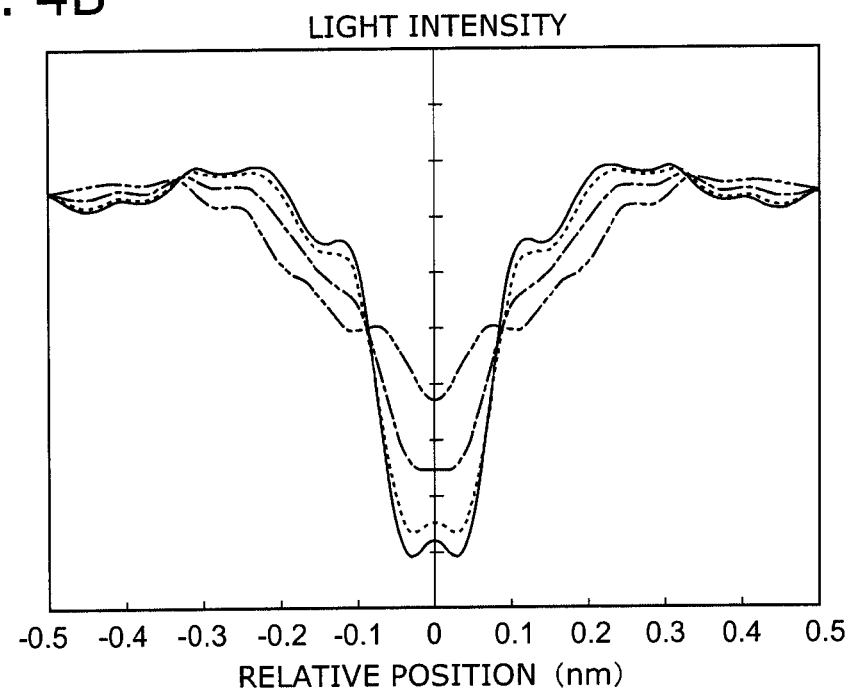

FIGS. 4A and 4B are graphs illustrating the change of the optical image with respect to the variation of focus. The horizontal axis represents position on the wafer, and the vertical axis represents light intensity. FIG. 4A shows the closest pattern, and FIG. 4B shows the other patterns.

First, the exposure optical system in the embodiment is described.

As shown in FIG. 1, in the exposure optical system 100 in the embodiment, a light source plane 101 and a lens 102 are placed along the optical axis O. At the time of exposure, a photomask 103 is placed between the light source plane 101 and the lens 102. Furthermore, a wafer 104 is placed on the opposite side of the lens 102 from the photomask 103. Here, in the exposure optical system 100, the extending direction of the optical axis O is defined as Z direction. The directions orthogonal to the Z direction and orthogonal to each other are defined as X and Y directions. Coordinates on the X, Y, and Z directions are denoted by x, y, and z, respectively. In FIG. 1, the optical axis O is depicted as a straight line. However, in an actual exposure apparatus, the optical axis O may be bent by e.g. mirrors and prisms.

As shown in FIGS. 2A and 2B, the photomask 103 has a configuration such that a light shielding pattern is selectively arranged on a transparent substrate 10 having translucency. Furthermore, regions R1 and R2 are defined on the photomask 103. The region R1 includes a main pattern 11 in which a plurality of line shapes are periodically arranged. The main pattern 11 is the finest pattern formed on the photomask 103. On the other hand, the region R2 includes a main pattern 12 in which a plurality of line shapes are periodically provided. However, its pitch is larger than the pitch of the main pattern 11 of the region R1. The region R2 includes an auxiliary pattern 13 besides the main pattern 12. The position and size of the auxiliary pattern 13 are determined by the method described later.

As shown in FIG. 1, light L emitted from part of the light source plane 101 of the exposure optical system 100 is incident on the photomask 103. The light L is diffracted primarily by the main pattern 11 to form a plurality of diffracted beams. Some of the plurality of diffracted beams, e.g., the zeroth order diffracted beam L0 and one first order diffracted beam L1, are incident on the lens 102 and converged. Then, the beams are applied to the wafer 104. The zeroth order diffracted beam L0 and the one first order diffracted beam L1 interfere on the wafer 104 and resolve the main patterns 11 and 12 of the photomask 103. On the other hand, the auxiliary pattern 13 is not resolved, because it is smaller than the resolution limit.

Here, the light source layout of the light source plane 101 needs to be determined based on the pitch of the main pattern 11 of the region R1, which is the closest pattern. The reason for this is as follows. As the pitch of the main pattern 11 is made shorter, the diffraction angle of the diffracted beam becomes larger. Hence, to cause both the zeroth order diffracted beam L0 and one first order diffracted beam L1 to be incident on the lens 102, the traveling direction of light L needs to be greatly inclined with respect to the optical axis O. This significantly restricts the light source layout. For instance, consider the case where the closest pattern is a line-and-space pattern as shown in FIG. 2A. In this case, as shown in FIG. 3, the light source can be placed only in the regions 101a and 101b where the circle representing the outer edge of the light source plane 101 overlaps the circles representing the pupils of the lens 102 as viewed by the diffracted beams.

Thus, the light source layout can be optimized for the main pattern 11, which is the closest pattern. Then, as shown in FIG. 4A, the main pattern 11 can be stably resolved on the wafer 104. That is, even if the position of the wafer 104 is displaced in the Z direction, i.e., defocused, the optical image scarcely changes. In contrast, as shown in FIG. 4B, for the main pattern 12, unless the auxiliary pattern 13 is appropriately placed, defocusing causes a large variation in the optical image and makes the resolution unstable.

Thus, in the embodiment, the position of the auxiliary pattern is determined by the following method.

In the following, a method for determining the auxiliary pattern according to the embodiment is described.

Figure 5:
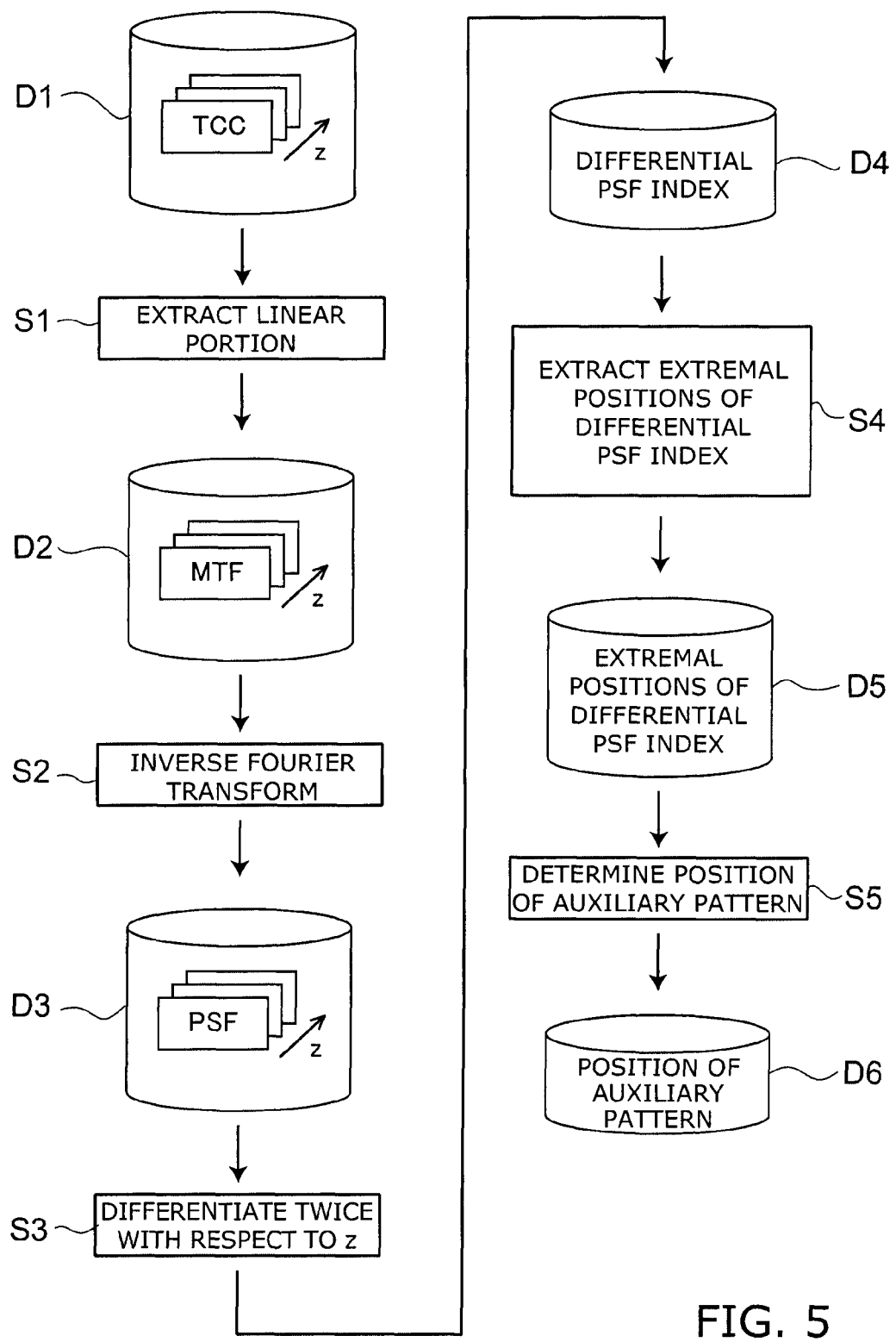
FIG. 5 is a flow chart illustrating a method for determining the position of an auxiliary pattern according to the first embodiment.

FIG. 5 is a flow chart illustrating a method for determining the position of an auxiliary pattern according to the embodiment.

Figure 6:
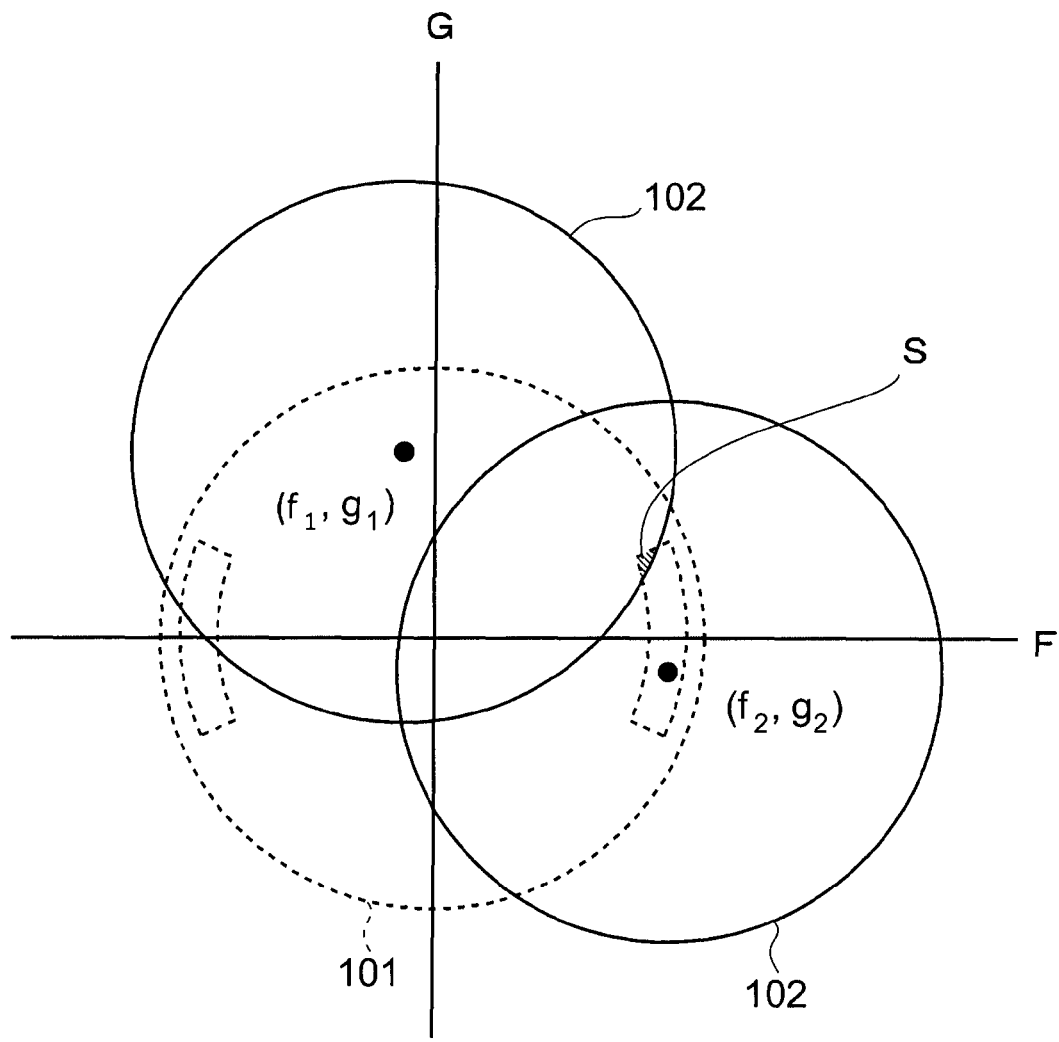
FIG. 6 shows TCC parameters.

FIG. 6 shows TCC parameters.

Figure 7:
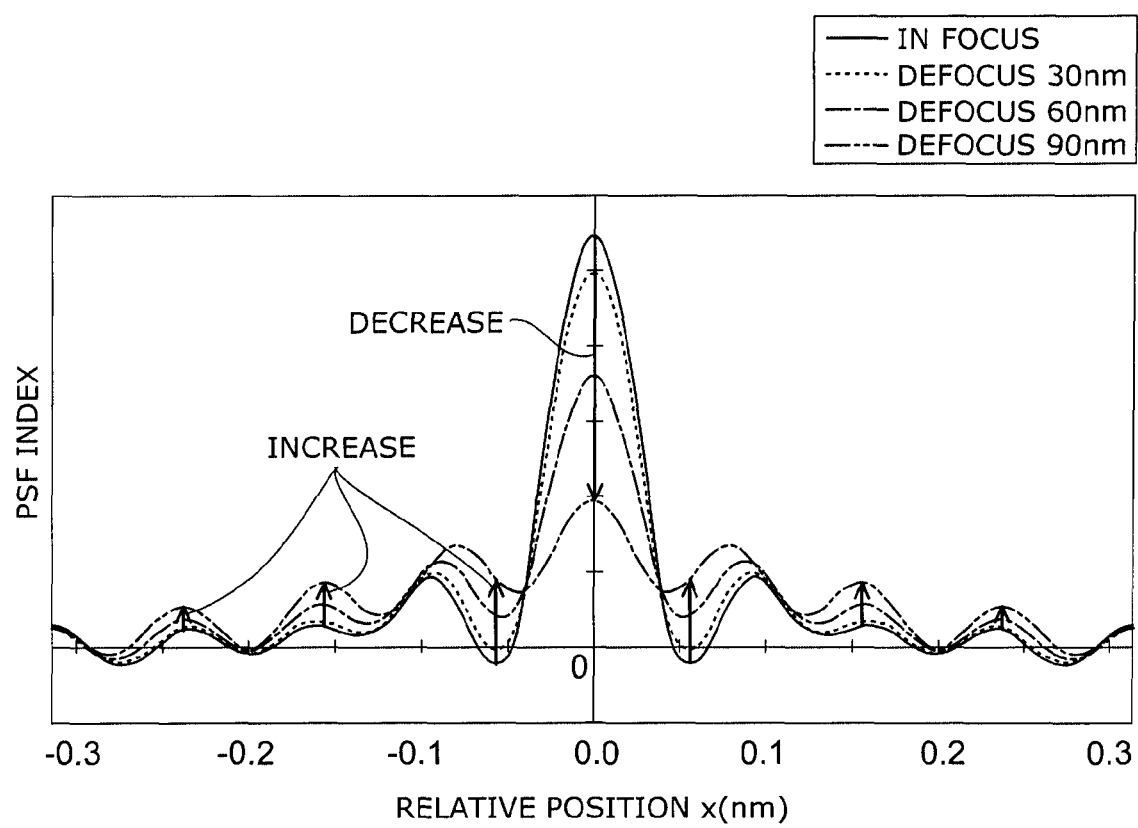
FIG. 7 is a graph illustrating the spatial profile of PSF index, where the horizontal axis represents position, and the vertical axis represents PSF index.

FIG. 7 is a graph illustrating the spatial profile of PSF index, where the horizontal axis represents position, and the vertical axis represents PSF index.

Figure 8:
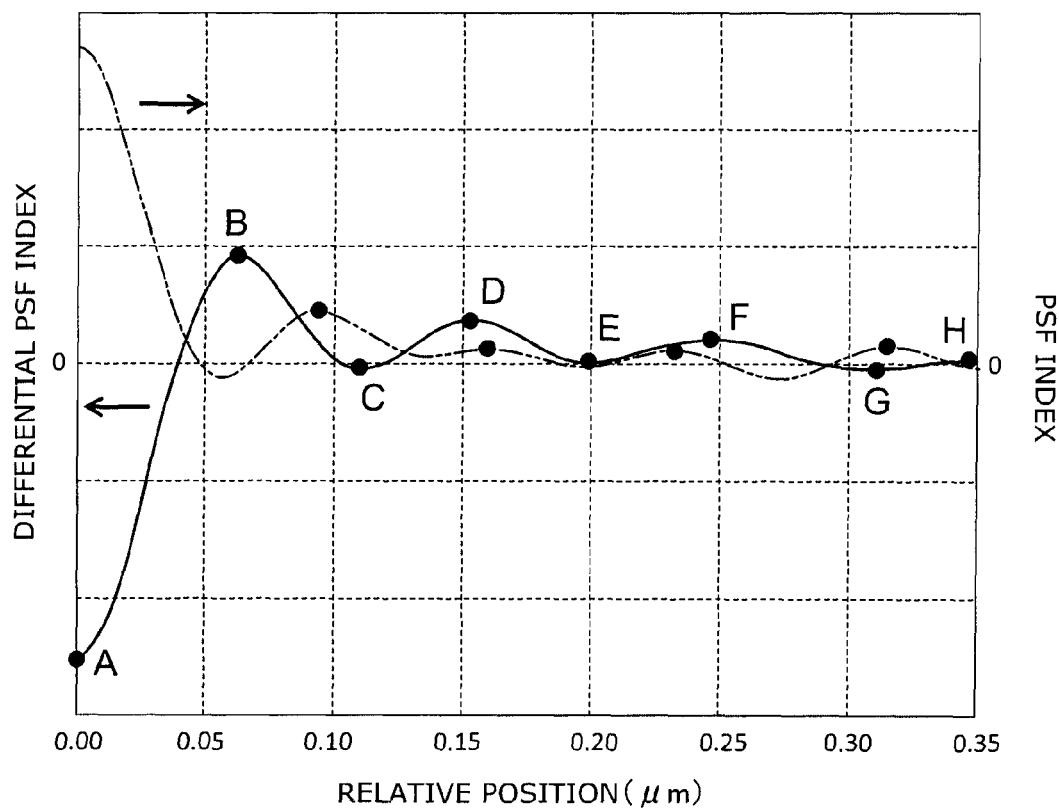
FIG. 8 is a graph illustrating the spatial profile of differential PSF index, where the horizontal axis represents position, and the vertical axis represents differential PSF index.

FIG. 8 is a graph illustrating the spatial profile of differential PSF index, where the horizontal axis represents position, and the vertical axis represents differential PSF index.

Here, FIG. 8 corresponds to the right side portion of FIG. 7. In FIG. 8, for comparison, part of FIG. 7 is superimposed.

First, as shown in data D1 of FIG. 5, for the exposure optical system 100, a transmission cross coefficient (TCC) is evaluated. TCC is a function expressing the performance of two diffracted beams creating an optical image. This function is specific to the optical system. Here, in evaluating TCC, the exposure optical system 100 does not include the photomask 103 and the wafer 104.

As shown in FIG. 6, in the embodiment, TCC is prepared as a data set including the center coordinates $(f_1, g_1)$ and $(f_2, g_2)$ in the frequency space of the pupils of the lens 102 as viewed by two diffracted beams, and an effective light source S corresponding to the area of the overlapping region S between these pupils and the light source. The effective light source S is expressed as a complex number. Hence, as numerical parameters, the effective light source S is composed of the real part Re(S) and the imaginary part Im(S).

TCC is evaluated for each of three or more imaging positions. More specifically, TCC is evaluated for the case where the wafer 104 is located at the focus position, and for a plurality of cases where the wafer 104 is displaced in the Z direction from the focus position. Preferably, TCC is evaluated for each of five or more imaging positions. In the embodiment, the "imaging position" refers to the position where the wafer 104 can be actually placed, including the focus position of the exposure optical system 100 and positions therearound. That is, in the actual exposure apparatus, the "imaging position" includes the placement position of the wafer 104 in focus, and placement positions of the wafer 104 defocused in a certain range. Furthermore, the "imaging plane" refers to the XY plane at the imaging position.

Next, as shown in step S1 of FIG. 5, a linearly treatable portion is extracted from each TCC. This extraction is the processing of coherent expansion for the partially coherent imaging optical system. Specifically, the projection plane (XY plane) of the optical image has two dimensions. Thus, the number of dimensions of TCC is reduced from four to two to extract a linearly treatable data set (first set) from TCC. Such a data set optically corresponds to MTF (modulation transfer function). Thus, the data set is hereinafter referred to as "MTF". Here, MTF is a function expressing the decrease of contrast in the optical system for each frequency.

There are several methods for reducing the number of dimensions. In the embodiment, the pair of coordinates ($f_1$, $g_1$) for one of the pupils in the frequency space is fixed to the coordinates (0, 0). Thus, the effective parameters are restricted to only ($f_2$, $g_2$), thereby reducing the number of dimensions from four to two. As shown in FIG. 1, one of two diffracted beams being incident on the lens 102 and forming the optical image is the zeroth order diffracted beam L0. The above dimensional reduction optically corresponds to the process in which only the component of TCC responsible for imaging with the zeroth order diffracted beam is extracted as a principal component. Typically, the zeroth order diffracted beam has the highest intensity of all the diffracted beams. Thus, the zeroth order diffracted beam is used as one of the diffracted beams for forming the optical image. Hence, the above processing for setting $f_1=0$ and $g_1=0$ corresponds to the actual exposure optical system. Thus, as shown in data D2 of FIG. 5, MTF is generated for each of three or more imaging positions.

Next, as shown in step S2 of FIG. 5, each MTF is inverse Fourier transformed. Thus, as shown in data D3, a data set (second set) of inverse Fourier transformed MTF is generated for each of the three or more imaging positions. This data set includes the coordinates (x, y) of the real space, and the real part Re(S) and the imaginary part Im(S) of the effective light source S corresponding thereto. This data set optically corresponds to PSF (point spread function). Thus, this data set is hereinafter referred to as "PSF". Here, PSF is a function expressing the spreading (blurring) of light in the real space occurring when the light emitted from a point light source passes through an optical system. PSF is related to the distribution of the amplitude of light on the imaging plane. Furthermore, in the embodiment, only the coherent portion is extracted from TCC to create MTF, and PSF is generated from the MTF. Hence, PSF also indicates the correlation, or coherence, between arbitrary two points on the photomask plane. The optical image on the imaging plane is calculated as the sum of PSF for respective points.

The vertical axis of FIG. 7 represents an index indicating the amplitude of light in PSF for a point light source. For instance, the vertical axis of FIG. 7 represents the product $S^2$ of the effective light source S and its complex conjugate S*, or $\sqrt{(S^2)}$. This index is hereinafter referred to as "PSF index". As shown in FIG. 7, the PSF index for a point light source has a prescribed distribution in the real space. If the imaging position (the Z coordinate of the wafer 104) changes, the distribution of the PSF index also changes. However, the change of the PSF index with respect to the change of z depends on the positions x, y. Thus, next, a position where the PSF index greatly changes with respect to the change of z, i.e., a position sensitive to defocusing, is determined.

As shown in step S3 of FIG. 5, from the PSF evaluated for three or more imaging positions, the second order differential of the PSF index with respect to z is calculated. This second order differential of the PSF index is hereinafter referred to as "differential PSF index". Thus, as shown in data D4 of FIG. 5, a differential PSF index is calculated for each (x, y). To obtain the second order differential, three or more points of data are needed. Thus, PSF needs to be evaluated for three or more imaging positions. Hence, TCC needs to be evaluated for three or more imaging positions. However, to enhance the accuracy of the second order differential, PSF is preferably evaluated for five or more imaging positions.

The relationship between z and the differential PSF index can be approximated by a quadratic function of z. Hence, z and the differential PSF index can be fitted to a quadratic function of z, and the differential PSF index can be obtained from the coefficient of the quadratic term (the term of $z^2$) of this quadratic function. Also in this case, three or more points of data are needed, and preferably there are five or more points of data. As the absolute value of the differential PSF index becomes larger, the change of the amplitude of light with respect to the change of z becomes steeper, and sensitive to defocusing.

Next, as shown in step S4 of FIG. 5 and in FIG. 8, positions with the differential PSF index assuming maximal or minimal values (hereinafter collectively referred to as "extremal values") are extracted. This extraction is performed by e.g. vertex extraction for the profile of the differential PSF index shown in FIG. 8. More specifically, the aforementioned differential PSF index is differentiated once with respect to x and y, and the position (x, y) where the first order differential becomes zero for both x and y is determined. Thus, as shown in data D5 of FIG. 5, the information of positions with the differential PSF index assuming extremal values on the wafer is obtained. In the example shown in FIG. 8, the positions with the differential PSF index assuming maximal values are positions B, D, F, and H. The positions with the differential PSF index assuming minimal values are positions A, C, E, and G.

Next, as shown in step S5 of FIG. 5, based on the information of positions with the differential PSF index assuming extremal values, the position of the auxiliary pattern is determined. In the following, a method for this is described. As described above, the profile of the PSF index shown in FIG. 7 and the profile of the differential PSF index shown in FIG. 8 each represent an impulse response for one point light source, and are not intensity distributions of the optical image on the imaging plane. The optical image corresponds to the sum of PSF indices for respective points. Hence, the change of the optical image due to defocusing is also determined by the sum of differential PSF indices for respective points. Thus, in the embodiment, the intensity change associated with defocusing is suppressed for the point light source, which exerts a particularly great influence on the degradation of the optical image associated with defocusing.

Specifically, in FIG. 8, it is assumed that the position of the edge of the main pattern 12 (see FIGS. 2A and 2B) is position A. Then, the intensity of light shown in FIG. 8 greatly changes at position A in the case of defocusing. Thus, the contrast of the edge of the optical image is degraded in accordance with defocusing. That is, this light can be said to greatly affect the degradation of the optical image associated with defocusing. The differential PSF index of this light assumes extremal values at positions B-H besides position A. However, among positions B-H, the position with the largest absolute value of the differential PSF index is position B, and the position with the next largest absolute value is position D.

Hence, for instance, the position to place an auxiliary pattern 13 on the photomask 103 is determined to be positions corresponding to positions B and D in the optical image projected on the wafer 104. Thus, as shown in data D6 of FIG. 5, the data of the placement position of the auxiliary pattern 13 is obtained. By placing the auxiliary pattern 13 at positions corresponding to positions B and D, the increase of the intensity (amplitude) of light associated with defocusing is suppressed at positions B and D on the wafer 104. By the law of energy conservation, the total amount of light projected on the wafer is constant even in the case of defocusing. Hence, if the increase of the amplitude of light is suppressed at positions B and D, the decrease of the amplitude of light is suppressed at position A. This suppresses the degradation of the optical image associated with defocusing, and ensures the lithography margin.

In the above example, the auxiliary pattern is placed at two positions corresponding to positions B and D. However, the auxiliary pattern may be placed only at one position corresponding to position B. Alternatively, in addition to positions B and D, the auxiliary pattern may be placed at a position corresponding to position F, where the absolute value of the differential PSF index is the third largest. That is, the number of auxiliary patterns per one main pattern is arbitrary. More specifically, the number of auxiliary patterns per one main pattern may be predefined. Alternatively, the auxiliary pattern may be formed at positions where the absolute value of the differential PSF index exceeds a reference value. In the case where the distance between the main patterns is close, the position of the auxiliary pattern may be determined in consideration of the relative positional relationship between a plurality of main patterns. In this case, PSF is evaluated centering on each edge of the adjacent main patterns. Based on the differential PSF index of the superposition of the PSF values, the position of the auxiliary pattern may be determined.

Next, the effect of the embodiment is described.

According to the embodiment, a linearly treatable portion is extracted from the TCC of the exposure optical system to calculate MTF. The MTF is inverse Fourier transformed to calculate PSF. A differential PSF index is evaluated as an index indicating the steepness of the change of the PSF index with respect to defocusing. For light with the absolute value of the differential PSF index assuming extremal values at the edge of the optical image of the main pattern, positions with the absolute value of the differential PSF index assuming extremal values are extracted. An auxiliary pattern is placed at some of these positions assuming extremal values. Thus, the placement position of the auxiliary pattern improving the lithography margin can be uniquely determined.

For instance, the method for determining the position of an auxiliary pattern according to the embodiment does not need the designer's decision. Hence, the method can be mostly or entirely performed by a computer. Thus, the position of the auxiliary pattern can be automatically determined. As a result, the position of the auxiliary pattern with a large lithography margin can be efficiently determined.

In this case, the program for determining the position of an auxiliary pattern on a photomask is a program causing a computer to execute the following processes.

(1) The process of generating MTF (first set) for each of three or more imaging positions of the exposure optical system by extracting a linearly treatable portion from TCC (transmission cross coefficient) for each of the three or more imaging positions.

(2) The process of generating PSF (second set) for each of the three or more imaging positions by inverse Fourier transforming each MTF generated in (1).

(3) The process of calculating a second order differential (differential PSF index) with respect to the imaging position z of the index (PSF index) indicating the amplitude of light belonging to PSF generated in (2).

(4) The process of extracting positions (x, y) where the differential PSF index determined in (3) assumes extremal values on the imaging plane of the exposure optical system.

(5) The process of setting the formation position of the auxiliary pattern to at least part of the positions on the photomask corresponding to the positions with the differential PSF index assuming extremal values on the imaging plane.

Originally, the exposure optical system for lithography is not a coherent optical system nor an incoherent optical system, but a partially coherent imaging optical system. Thus, the optical image formed on the wafer surface does not conserve linearity in terms of the amount or amplitude of light emitted from respective points of the light source. Hence, the influence of the respective points on the photomask plane exerting on imaging on the wafer surface cannot be independently evaluated. Conversely, the pattern of the photomask cannot be inversely calculated from the optical image to be formed on the wafer surface. Thus, determination of the position of the auxiliary pattern on the photomask needs to be addressed as an optimization problem.

However, the number of auxiliary patterns and the position and dimension of each of them have respective degrees of freedom, and the number of their combinations is huge. Thus, exhaustive search for an optimal solution impractically takes a long time. Alternatively, exploratory search for an optimal solution may be considered. In exploratory search, the designer may determine the initial layout of the auxiliary pattern based on his/her experience. Starting from the initial layout, fine tuning and simulation-based verification of the pattern are repeated to search for an optimal solution in an exploratory manner. However, this method also requires huge time and cost for the search. Furthermore, the result may depend on the initial layout and the search algorithm. Thus, the problem is that it is not clear whether or not the layout obtained by the search is a true optimal solution.

In contrast, according to the embodiment, a coherent portion is extracted from the partially coherent imaging optical system. Hence, although as an approximate determination, the layout of the auxiliary pattern can be uniquely determined. As a result, the designer's arbitrary decision can be excluded. Furthermore, the number of times of calculation can be reduced, and the time required for the design of the photomask can be significantly reduced.

Next, a test example of the embodiment is described.

In this test example, the focus margin was simulated for a plurality of circuit patterns to verify the effect of the embodiment.

FIGS. 9A to 9C show lithography margins for a plurality of circuit patterns with different line widths and line-to-line spaces. Here, FIG. 9A shows a first comparative example, FIG. 9B shows a second comparative example, and FIG. 9C shows a practical example of the embodiment.

Figure 10:
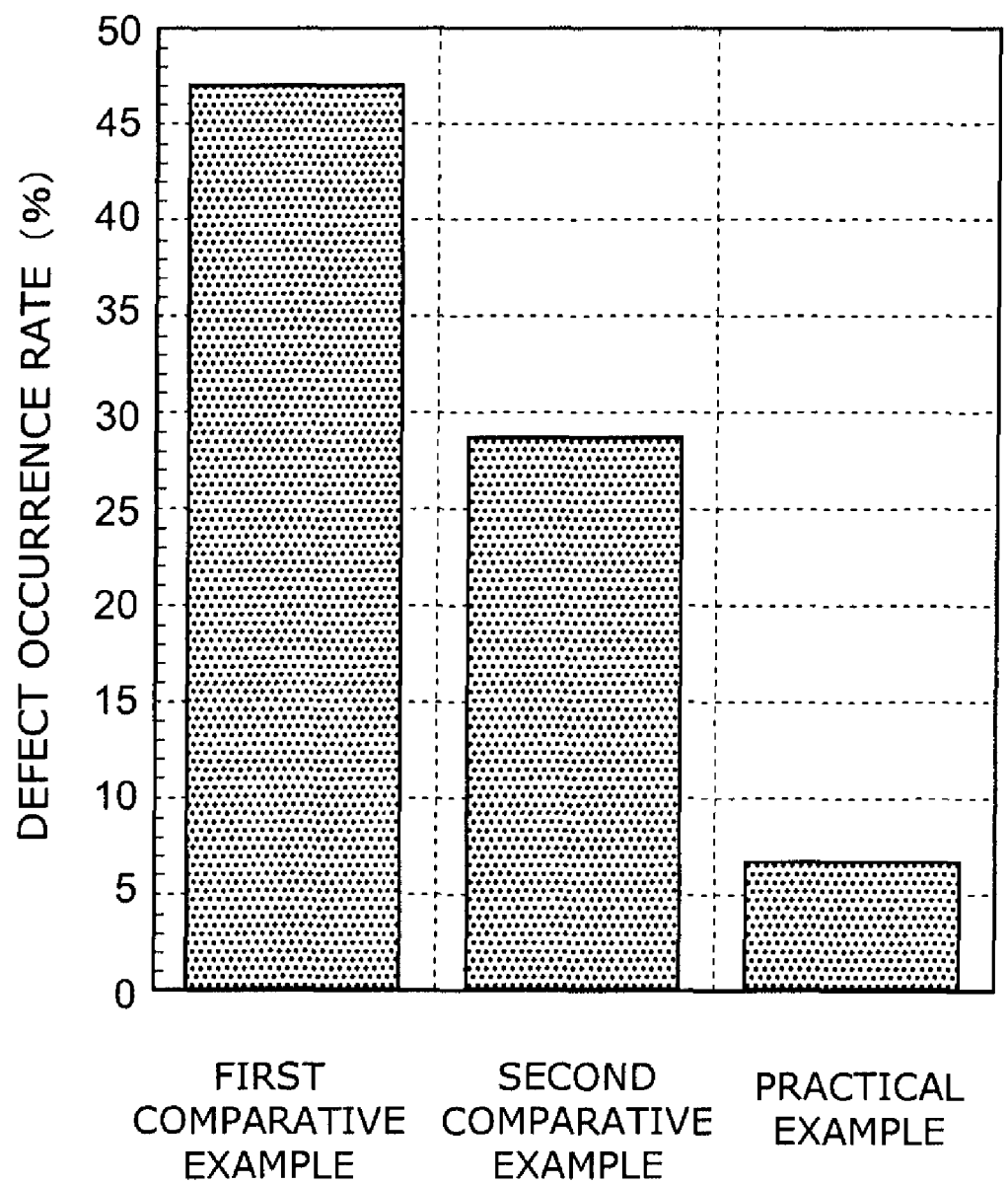
FIG. 10 is a bar chart showing the defect occurrence rate of the examples shown in FIGS. 9A to 9C.

FIG. 10 is a bar chart showing the defect occurrence rate of the examples shown in FIGS. 9A to 9C.

First, line-and-space circuit patterns were assumed in which a plurality of wiring lines are periodically arranged parallel to each other. Here, a plurality of circuit patterns with different line widths and line-to-line spaces were assumed.

Then, for each circuit pattern, three photomasks were assumed as follows.

(1) First Comparative Example

In the photomask of the first comparative example, no auxiliary pattern was provided. Only a main pattern geometrically similar to the circuit pattern was provided.

(2) Second Comparative Example

In the photomask of the second comparative example, besides the main pattern, an auxiliary pattern was placed in accordance with the PSF index. That is, an auxiliary pattern was placed at part of the positions with the PSF index assuming extremal values shown in FIG. 7.

(3) Practical Example

In the photomask of the practical example, by the aforementioned method for determining the position of an auxiliary pattern according to the embodiment, an auxiliary pattern was placed in accordance with the differential PSF index. That is, an auxiliary pattern was placed at part of the positions with the differential PSF index assuming extremal values shown in FIG. 8.

For each photomask corresponding to the above circuit pattern, the mask dimension was corrected by OPC (optical proximity correction). The optical image formed on the wafer by exposure using the corrected photomask was simulated. Next, the dimension of the optical image was measured to calculate the focus margin. Then, the calculation result of the focus margin reaching a reference value was determined to be "OK", and the calculation result not reaching the reference value was determined to be "NG". The results are shown in FIGS. 9A to 9C. Furthermore, for the results shown in FIGS. 9A to 9C, the ratio of the number of circuit patterns determined to be "NG" to the total number of circuit patterns is calculated. The ratio is referred to as defect occurrence rate and shown in FIG. 10.

As shown in FIGS. 9A to 9C and 10, in the first comparative example with no auxiliary pattern, the defect occurrence rate was as high as 47%. In the second comparative example with the placement of the auxiliary pattern based on the PSF index, the defect occurrence rate was 28%. This was better than that of the first comparative example, but the effect was limited. In contrast, in the practical example of the embodiment with the placement of the auxiliary pattern based on the differential PSF index, the defect occurrence rate was successfully suppressed to 7%.

Next, a second embodiment is described.

The embodiment is different from the above first embodiment in the method for extracting a linearly treatable portion from TCC. More specifically, in the above first embodiment, the process of extracting a linear portion shown in step S1 of FIG. 5 is performed by fixing the coordinates $(f_1, g_1)$ to the coordinates $(0, 0)$. In contrast, in the embodiment, the process of extracting a linear portion shown in step S1 is performed by eigenvalue expansion in which TCC is expanded in a series of eigenfunctions. Specifically, the TCC parameters $f_1$, $g_1$, $f_2$, and $g_2$ are combined into a first principal component $P_1$ having the largest contribution to the effective light source S. Furthermore, the parameters are combined into a second principal component $P_2$ having the next largest contribution. Then, MTF including the principal components $P_1$ and $P_2$ is generated. The method and effect of the embodiment other than the foregoing are similar to those of the above first embodiment.

Next, a third embodiment is described.

The embodiment relates to a method for manufacturing a photomask.

First, the positions of main patterns 11 and 12 (see FIGS. 2A and 2B) on a photomask 103 are determined based on a circuit pattern to be formed on a wafer 104 (see FIG. 1). Next, by the method according to the above first or second embodiment, the position of an auxiliary pattern 13 is determined. Next, by OPC, the mask dimension is corrected. Thus, the layout of the photomask is determined.

Next, as shown in FIGS. 2A and 2B, a transparent substrate 10 with translucency made of e.g. quartz is prepared. On the transparent substrate 10, a light shielding film made of e.g. chromium is formed. Next, an electron beam resist film is formed on the light shielding film. By electron beam writing, the above layout is written on the electron beam resist film. Next, the electron beam resist film is selectively removed by development to form a resist pattern. Next, this resist pattern is used as a mask to etch the above light shielding film. Thus, the light shielding film is selectively removed. The remaining portion of the light shielding film constitutes main patterns 11 and 12 and an auxiliary pattern 13. Subsequently, the resist pattern is removed. Thus, a photomask 103 is manufactured.

According to the embodiment, a photomask can be manufactured with the position of the auxiliary pattern determined based on the method according to the above first or second embodiment. The photomask of the embodiment has a short design time, and hence has a low manufacturing cost. Furthermore, this photomask enables exposure in the resolution limit region while ensuring the focus margin for the entire region of the circuit pattern. Here, in the examples described in the above first and second embodiments and the embodiment, the main pattern and the auxiliary pattern of the photomask are light shielding regions, and the other region is a translucent region. However, the main pattern and the auxiliary pattern may be translucent regions, and the other region may be a light shielding region. In this case, the opening of a light shielding film is formed in the region constituting the main pattern and the auxiliary pattern on the upper surface of the transparent substrate 10.

Next, a fourth embodiment is described.

The embodiment relates to a method for manufacturing a semiconductor device.

First, the wafer 104 shown in FIG. 1 is prepared. The wafer 104 may be e.g. a silicon wafer, a silicon wafer with an insulating film formed thereon, or a silicon wafer with an insulating film formed thereon and a conductive film formed further thereon.

Next, a resist film (not shown) is formed on the wafer 104. Next, the photomask 103 manufactured in the above third embodiment is used to perform exposure on the resist film by the exposure optical system 100 shown in FIG. 1. Next, this resist film is developed. Thus, the resist film is selectively removed to form a resist pattern.

Next, this resist pattern is used as a mask to perform processing on the wafer 104. The content of the processing can be various. For instance, in the case where the wafer 104 is a silicon wafer, the resist pattern can be used as a mask to perform dry etching. Thus, a trench can be formed in the upper surface of the silicon wafer. Furthermore, the resist pattern can be used as a mask to perform ion implantation. Thus, an impurity diffusion layer can be selectively formed in the upper portion of the silicon wafer. In the case where the wafer 104 is a silicon wafer with an insulating film formed thereon, the resist pattern can be used as a mask to perform dry etching. Thus, the insulating film can be patterned. In the case where the wafer 104 is a silicon wafer with an insulating film formed thereon and a conductive film formed further thereon, the resist pattern can be used as a mask to perform dry etching. Thus, the conductive film is patterned to form wiring.

According to the embodiment, in the region of the wafer 104 subjected to exposure by the region R1 of the photomask 103, the closest pattern can be accurately formed in the resolution limit region of the exposure. On the other hand, in the region subjected to exposure by the region R2, a circuit pattern having a larger pitch than the closest pattern can be stably formed while ensuring a sufficient focus margin.

For instance, a NAND flash memory can be manufactured as the semiconductor device. In this case, the wiring can be formed by the above method. Thus, bit lines in the memory region can be formed in the region of the wafer 104 subjected to exposure by the region R1 of the photomask 103. On the other hand, the wiring of the cell region or the peripheral circuit region can be formed in the region subjected to exposure by the region R2. Thus, while increasing the packing density of memory cells by reducing the arrangement pitch of bit lines, the wiring can be stably formed also in the cell region or the peripheral circuit region.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The embodiments described above can realize a method for determining the position of an auxiliary pattern, a method for manufacturing a photomask, and a method for manufacturing a semiconductor device in which the position of the auxiliary pattern with a large lithography margin can be efficiently determined.

What is claimed is:

1. A method for determining position of an auxiliary pattern on a photomask, comprising:
   generating by a computer a first set for each of three or more imaging positions of an exposure optical system by extracting a linearly treatable portion from a transmission cross coefficient for each of the three or more imaging positions;
   generating by a computer a second set for each of the three or more imaging positions by inverse Fourier transforming each of the first set;
   calculating by a computer a second order differential with respect to the imaging position of an index indicating amplitude of light belonging to the second set; and
   extracting by a computer a position where the second order differential assumes an extremal value on an imaging plane of the exposure optical system,
   at least part of positions on the photomask each corresponding to the position assuming the extremal value on the imaging plane being used as a formation position of the auxiliary pattern.

2. The method according to claim 1, wherein
   the transmission cross coefficient includes parameters expressing directions of two diffracted beams generated in the exposure optical system, and
   number of types of parameters included in the first set is smaller than number of types of parameters included in the transmission cross coefficient.

3. The method according to claim 2, wherein the generating the first set includes setting part of the parameters expressing the directions of the diffracted beams to zero.

4. The method according to claim 2, wherein in the generating the first set, one of the two diffracted beams is set to a zeroth order diffracted beam.

5. The method according to claim 1, wherein the generating the first set includes performing eigenvalue expansion of the transmission cross coefficient.

6. The method according to claim 1, wherein the calculating the second order differential includes fitting the imaging position and the index indicating the amplitude of light to a quadratic function and using a coefficient of a quadratic term of the quadratic function as the second order differential.

7. A method for manufacturing a photomask, comprising:
   forming a light shielding film on a transparent substrate; and
   forming a main pattern and an auxiliary pattern on the transparent substrate by selectively removing the light shielding film,
   placement position of the auxiliary pattern being determined by a method for determining position of the auxiliary pattern on the photomask,
   the method for determining the position of the auxiliary pattern on the photomask including:
      generating a first set for each of three or more imaging positions of an exposure optical system by extracting a linearly treatable portion from a transmission cross coefficient for each of the three or more imaging positions;
      generating a second set for each of the three or more imaging positions by inverse Fourier transforming each of the first set;
      calculating a second order differential with respect to the imaging position of an index indicating amplitude of light belonging to the second set; and
      extracting a position where the second order differential assumes an extremal value on an imaging plane of the exposure optical system,
      at least part of positions on the photomask each corresponding to the position assuming the extremal value on the imaging plane being used as a formation position of the auxiliary pattern.

8. The method according to claim 7, wherein
   the main pattern is formed in a line shape, and
   a plurality of the main patterns are periodically arranged.

9. A method for manufacturing a semiconductor device, comprising:
   forming a resist film on a wafer;
   performing exposure on the resist film using a photomask manufactured by a method for manufacturing the photomask;
   forming a resist pattern by developing the resist film; and performing processing on the wafer using the resist pattern as a mask the method for manufacturing the photomask including:

forming a light shielding film on a transparent substrate; and forming main patterns and an auxiliary pattern on the transparent substrate by selectively removing the light shielding film, placement position of the auxiliary pattern being determined by a method for determining position of the auxiliary pattern on the photomask, the method for determining the position of the auxiliary pattern on the photomask including:

generating a first set for each of three or more imaging positions of an exposure optical system by extracting a linearly treatable portion from a transmission cross coefficient for each of the three or more imaging positions;

generating a second set for each of the three or more imaging positions by inverse Fourier transforming each of the first set;

calculating a second order differential with respect to the imaging position of an index indicating amplitude of light belonging to the second set; and extracting a position where the second order differential assumes an extremal value on an imaging plane of the exposure optical system, at least part of positions on the photomask each corresponding to the position assuming the extremal value on the imaging plane being used as a formation position of the auxiliary pattern, each of the main patterns being formed in a line shape, and the main patterns being periodically arranged.

10. The method according to claim 9, wherein the three or more imaging positions include a position for a case where the wafer is located at a focus position in the exposure, and a plurality of positions for cases where the wafer is displaced in a direction of an optical axis of the exposure from the focus position.

* * * * *